(12) United States Patent  
Roohparvar

(10) Patent No.: US 8,037,378 B2
(45) Date of Patent: Oct. 11, 2011

(54) AUTOMATIC TEST ENTRY TERMINATION IN A MEMORY DEVICE

(75) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 1068 days.

(21) Appl. No.: 11/452,696

(22) Filed: Jun. 14, 2006

(65) Prior Publication Data

US 2006/0236164 A1    Oct. 19, 2006

Related U.S. Application Data

(62) Division of application No. 10/431,768, filed on May 8, 2003, now Pat. No. 7,155,644.

(51) Int. Cl.
*G11C 29/00* (2006.01)
*G11C 7/00* (2006.01)
(52) U.S. Cl. ................... 714/718; 365/200
(58) Field of Classification Search ........... 714/718; 365/200

See application file for complete search history.

(56) References Cited

U.S. PATENT DOCUMENTS

| | | | |
|---|---|---|---|
| 5,394,403 A | 2/1995 | Klein | |
| 5,526,311 A * | 6/1996 | Kreifels et al. | 365/201 |
| 5,627,478 A * | 5/1997 | Habersetzer et al. | 324/763 |
| 5,671,183 A * | 9/1997 | Soenen et al. | 365/189.12 |
| 5,905,690 A | 5/1999 | Sakurai | |
| 5,950,145 A | 9/1999 | Roohparvar | |
| 6,028,798 A | 2/2000 | Roohparvar | |
| 6,108,798 A | 8/2000 | Heidel | |
| 6,154,851 A * | 11/2000 | Sher et al. | 714/5 |
| 6,160,413 A * | 12/2000 | Habersetzer et al. | 324/763 |
| 6,353,563 B1 | 3/2002 | Hii | |
| 6,452,848 B1 | 9/2002 | Obremski | |
| 6,499,124 B1 * | 12/2002 | Jacobson | 714/727 |
| 6,621,293 B2 * | 9/2003 | Wingen | 326/37 |
| 6,823,282 B1 * | 11/2004 | Snyder | 702/120 |
| 6,888,765 B1 * | 5/2005 | Kotowski et al. | 365/201 |
| 2006/0036916 A1 * | 2/2006 | Janzen | 714/718 |
| 2006/0048033 A1 * | 3/2006 | Louie et al. | 714/742 |

FOREIGN PATENT DOCUMENTS

EP    0589553 A1 *  3/1994

OTHER PUBLICATIONS

Scan Based Side Channel Attack on Dedicated hardware implementations of Data Encryption Standard' by Yang et al. International Test Conference, Proceedings. ITC 2004. Publication Date: Oct. 26-28, 2004 pp. 339-344 ISBN: 0-7803-8580-2 INSPEC Accession Number: 8291736.*

"Automatic Test Equipment (ATE) on a Network (securing access tO equipment and data)" by McCarty, AUTOTESTCON Proceedings, 2000 IEEE Publication Date: 2000 on pp. 490-496 ISBN: 0-7803-5868-6 INSPEC Accession Number: 6812928.*

* cited by examiner

*Primary Examiner* — Cynthia Britt
(74) *Attorney, Agent, or Firm* — Leffert Jay & Polglaze, P.A.

(57) ABSTRACT

A memory device has a control register comprising a test mode disable bit. The test mode is initially enabled. If the device does not receive an appropriate key or command as the next command received, the test mode is disabled. If the appropriate key is received, the test mode is continued to be enabled until it is expressly disabled by the user.

20 Claims, 3 Drawing Sheets

AUTOMATIC TEST ENTRY TERMINATION IN A MEMORY DEVICE

RELATED APPLICATION

This Application is a Divisional of U.S. application Ser. No. 10/431,768, titled "AUTOMATIC TEST ENTRY TERMINATION IN A MEMORY DEVICE," filed May 8, 2003, now U.S. Pat. No. 7,155,644 which is commonly assigned and incorporated herein by reference.

TECHNICAL FIELD OF THE INVENTION

The present invention relates generally to memory devices and in particular the present invention relates to test modes in memory devices.

BACKGROUND OF THE INVENTION

Flash memory devices have developed into a popular source of non-volatile memory for a wide range of electronic applications. Flash memory devices typically use a one-transistor memory cell that allows for high memory densities, high reliability, and low power consumption. Common uses for flash memory include portable computers, personal digital assistants (PDAs), digital cameras, and cellular telephones. Program code, system data such as a basic input/output system (BIOS), and other firmware can typically be stored in flash memory devices. Most electronic devices are designed with a single flash memory device.

NAND flash memory devices are becoming popular due to the high memory densities possible at a relatively low cost. The NAND architecture connects 8, 16 or 32 memory cells in series on a single bit line.

NAND flash memory devices can typically be sold to an end user, sold to a memory card manufacturer for combination with a memory controller on memory cards such as MMC cards and SD cards, or combined with a controller by the memory manufacturer to produce a memory card. In any case, the memory device must be tested before the memory device can be sold.

The manufacturing and testing of NAND memory devices is a complicated process. Many tests and functions are needed to make the part reliable. To accomplish this, the memory manufacturers have provided test modes to perform various test functions on the memory device. Some test functions could stress the part beyond its datasheet limits in order to determine if anything will break. These test modes should not be available to the end user of the memory device or the end user of the memory card.

To keep the end user from accessing the test modes, and possibly destroying the part, the manufacturers typically make it difficult to enter these modes. This can be accomplished by using complicated command sequences combined with high voltages on specific pins. This makes it very difficult for end users to enter the test modes since these voltages are not available on the memory cards or end systems. However, this might also make it difficult for some end users to test the parts if they have to generate the high voltages.

If the memory device is sold to an end user, it is desirable to disable any low voltage test mode. If the memory devices are put on cards at the memory manufacturer, it is desirable to have a low voltage test mode available since high voltages are not normally available on the memory card. Also, the testing of the functionality of a NAND flash memory device might be done on a memory card to make the cost more favorable.

For the reasons stated above, and for other reasons stated below which will become apparent to those skilled in the art upon reading and understanding the present specification, there is a need in the art for an improved memory device test entry termination.

DETAILED DESCRIPTION

Figure 1:
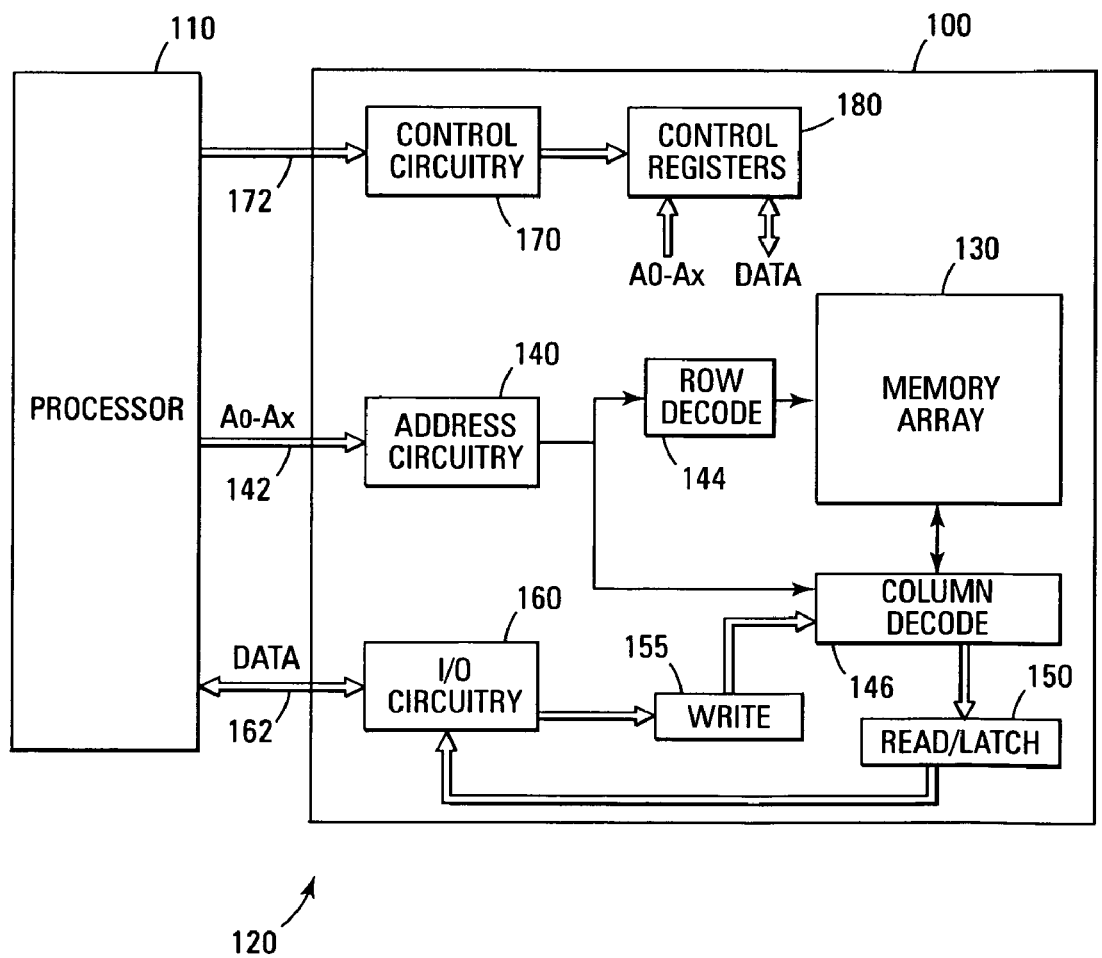
FIG. 1 shows a block diagram of one embodiment of a memory system of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a functional block diagram of a memory device 100 of one embodiment of the present invention that is coupled to a processor 110. The processor 110 may be a microprocessor, a processor, or some other type of controlling circuitry. The memory device 100 and the controller 110 form part of an electronic system 120. The memory device 100 has been simplified to focus on features of the memory that are helpful in understanding the present invention.

The memory device includes an array of memory cells 130. The memory cells are non-volatile floating-gate memory cells and the memory array 130 is arranged in banks of rows and columns. In one embodiment, the memory array is a NAND-type architecture. In another embodiment, the memory array is a NOR-type architecture. The present invention is not limited to any one type of memory array architecture.

An address buffer circuit 140 is provided to latch address signals provided on address input connections A0-Ax 142. Address signals are received and decoded by a row decoder 144 and a column decoder 146 to access the memory array 130. It will be appreciated by those skilled in the art, with the benefit of the present description, that the number of address input connections depends on the density and architecture of the memory array 130. That is, the number of addresses increases with both increased memory cell counts and increased bank and block counts.

The memory device 100 reads data in the memory array 130 by sensing voltage or current changes in the memory array columns using sense/latch circuitry 150. The sense/latch circuitry, in one embodiment, is coupled to read and latch a row of data from the memory array 130. Data input and output buffer circuitry 160 is included for bi-directional data communication over a plurality of data connections 162 with the controller 110). Write circuitry 155 is provided to write data to the memory array.

Control circuitry 170 decodes signals provided on control connections 172 from the processor 110. These signals are used to control the operations on the memory array 130, including data read, data write, and erase operations. In one embodiment, the control circuitry 170 is a microcontroller that executes the embodiments of the automatic test entry termination methods of the present invention.

Chip select generation circuitry 125 generates the chip select signals for the memory device 100. This circuitry 125 uses the address connections 142 from the processor 110 to generate the appropriate chip select signal depending on the address present on the address connections 142.

The flash memory device illustrated in FIG. 1 has been simplified to facilitate a basic understanding of the features of the memory. A more detailed understanding of internal circuitry and functions of flash memories are known to those skilled in the art.

Figure 2:
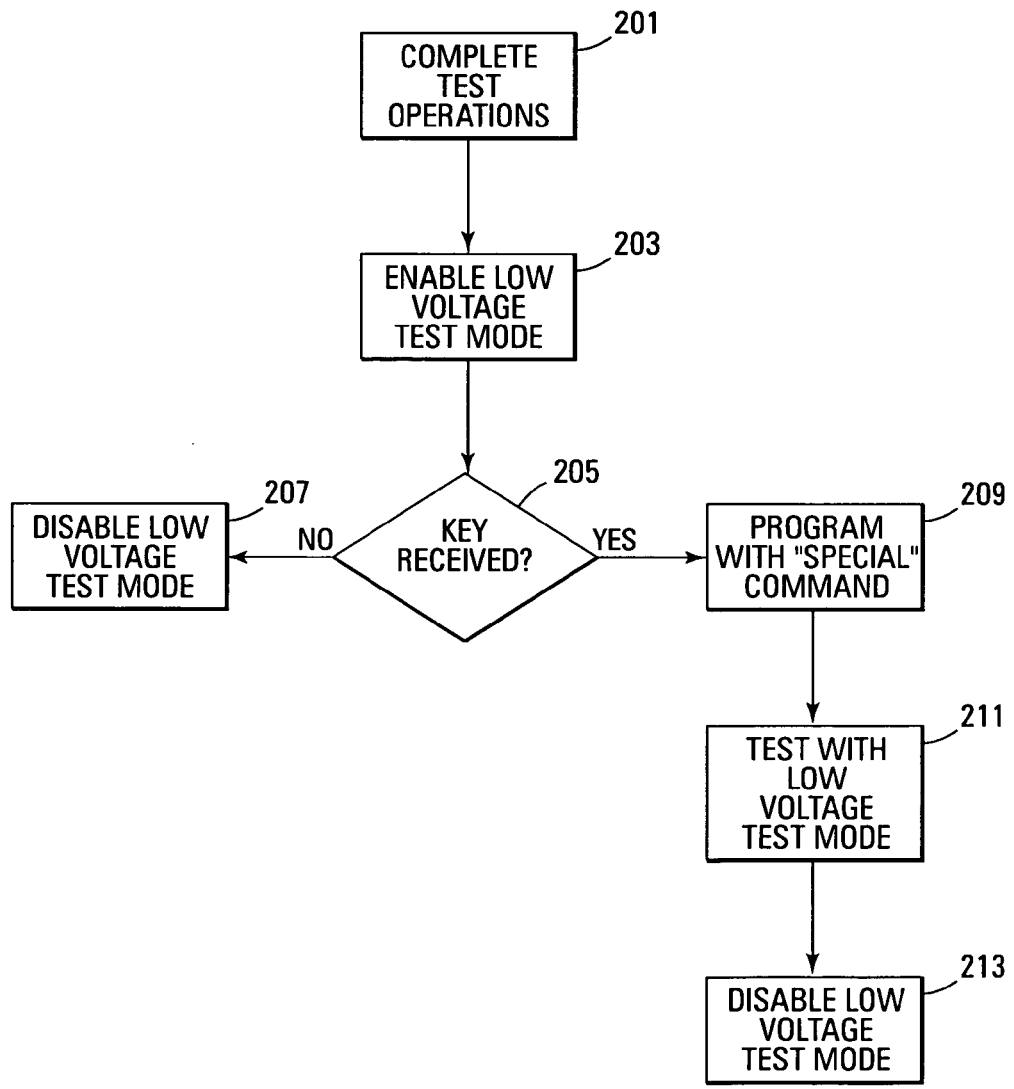
FIG. 2 shows a flowchart of one embodiment of an automatic test entry termination method of the present invention.

FIG. 2 illustrates a flowchart of one embodiment of the automatic test entry termination method of the present invention. In this embodiment, the high voltage testing is performed prior to the memory device being mounted in memory card or other product. For example, the high voltage testing may be done in a test fixture that can provide the required voltages to stress the part.

After the initial testing is complete 201, the low voltage test mode is enabled 203. This may be accomplished by setting a test mode enable bit in the control register 180 illustrated in FIG. 1. If the memory device does not receive a key 205 as its next command, the low voltage test mode is disabled 207. This can be accomplished by setting a test mode disable bit in the control register 180 of FIG. 1, by resetting the enable bit to another state, or some other way of flagging a disabled test mode.

In the embodiment of FIG. 2, the key received by the memory device is a unique program command. For example, if a normal program command is a 40H, a command of 49H may be used to not only perform a program command but also to keep the low voltage test mode from being disabled. If the normal program command of 40H was received as the next command after the test mode enable bit was set, the device would permanently disable the low voltage test mode such that it is no longer available to an end user.

If the special program command was received, the program operation is initiated 209. The low voltage test mode can still be initiated at any time after that 211. In this embodiment, if the low voltage test mode is enabled by receipt of the key, the test mode will not be disabled until a command is received to expressly disable the mode 213. In other words, the device may go through multiple read and program operations prior to the test mode finally being initiated and then disabled 213.

Figure 3:
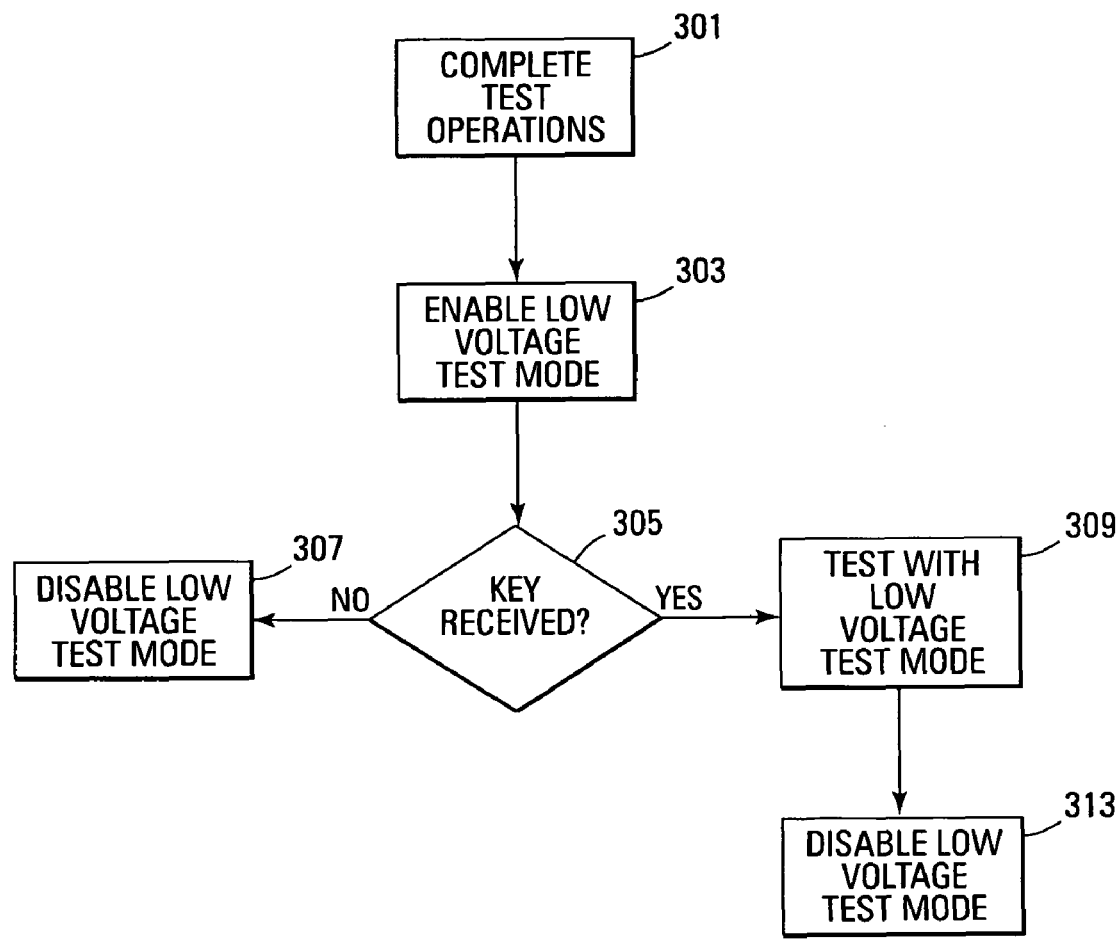
FIG. 3 shows a flowchart of another embodiment of an automatic test entry termination method of the present invention.

FIG. 3 illustrates a flowchart of an alternate embodiment of the automatic test entry termination method of the present invention. This embodiment enables the low voltage test mode 303 after the initial test operations are complete 301.

The key in this embodiment is a sequence that does not affect the device's operation but only informs the part that the low voltage test mode should not be disabled. For example, the key may be the special program command 49H with data of FFFF. The microcontroller of the present invention does not recognize this command and data to initiate a program operation but instead causes the microcontroller to not disable the test mode. In an alternate embodiment, the key is a sequence of multiple commands.

If the next command received after the low voltage test mode is enabled is not the required key 305, the test mode is disabled 307 such that it is no longer available to an end user. If the key is received 305, the low voltage test mode is initiated 309. The test mode can then be disabled 313 at some subsequent time as discussed previously. This can be accomplished by setting a test mode disable bit in the control register 180 of FIG. 1, by resetting the enable bit to another state, or some other way of flagging a disabled test mode.

CONCLUSION

The embodiments of the present invention enable a memory device to have a test mode that is available to anyone having a key. If the key is the next command received by the memory device after enablement of the test mode, the test mode remains available. If any command besides the key is received, the test mode is disabled. The present invention prevents an unauthorized end user from having access to the test modes of the part, thereby potentially damaging the part.

The embodiments of the present invention are not limited to any one type of memory technology. For example, the scratch control memory array may be implemented in a NOR-type flash memory device, a NAND-type flash memory device, or any other type memory device that can be constructed with such a memory array.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for disabling entry to a test mode in a memory device, the method comprising:
receiving a command; and
if the received command is not a predetermined key, permanently disabling the test mode.

2. The method of claim 1 wherein the predetermined key is a program command that initiates a programming operation of the device.

3. The method of claim 1 and further including executing the received command.

4. The method of claim 1 wherein the test mode is a low voltage test mode.

5. The method of claim 1 wherein the predetermined key is comprised of a command and associated data.

6. The method of claim 5 wherein the command is a predetermined program command with data that is composed of logical ones.

7. The method of claim 1 and further including disabling the test mode if the predetermined key is not received immediately after a test mode enable command.

8. A method for disabling entry to a test mode in a memory device, the method comprising:
completing a test operation;
enabling a low voltage test mode;
receiving a command; and
if the received command is not the predetermined key, permanently disabling the low voltage test mode.

9. The method of claim 8 wherein the test operation is a high voltage test operation.

10. The method of claim 8 wherein enabling the low voltage test mode comprises setting a test mode enable bit in a control register of the device.

11. The method of claim 8 wherein the memory device is a flash memory device.

12. The method of claim 11 wherein the flash memory device is comprised of a NAND architecture.

13. A method for disabling entry to a test mode in a memory device, the method comprising:
- completing test operations;
- enabling a low voltage test mode;
- receiving a command;
- if the received command is the predetermined key, permitting initiation of the test mode; and
- permanently disabling the test mode subsequent to permitting initiation of the test mode.

14. The method of claim 13 wherein the memory device is one of a NAND flash memory device or a NOR flash memory device.

15. The method of claim 13 and further including receiving a command to disable the test mode.

16. A method for disabling entry to a test mode in a memory device, the method comprising:
- enabling a low voltage test mode;
- receiving a command;
- if the received command is not comprised of a predetermined key, permanently disabling the low voltage test mode; and
- if the received command is comprised of the predetermined key, permitting initiation of the low voltage test mode.

17. A method for disabling entry to a test mode in a memory device, the method comprising:
- enabling a low voltage test mode;
- receiving a command;
- if the received command is not a predetermined key, permanently disabling the low voltage test mode;
- if the received command is the predetermined key, initiating the low voltage test mode; and
- executing the received command.

18. The method of claim 17 wherein the memory device is a non-volatile memory device.

19. The method of claim 17 wherein disabling the low voltage test mode comprises setting a bit in a control register to disable the test mode.

20. The method of claim 19 wherein the predetermined key is an unused program command.

* * * * *